(12) United States Patent
Wu et al.

(10) Patent No.: US 8,912,065 B2
(45) Date of Patent: Dec. 16, 2014

(54) METHOD OF FABRICATING SEMICONDUCTOR DEVICE

(75) Inventors: Tieh-Chiang Wu, Yilan County (TW);
Wei-Ming Liao, Taoyuan County (TW);
Jei-Cheng Huang, New Taipei (TW);
Shin-Yu Nieh, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/523,912

(22) Filed: Jun. 15, 2012

(65) Prior Publication Data
US 2013/0337629 A1    Dec. 19, 2013

(51) Int. Cl.
*H01L 21/336*    (2006.01)

(52) U.S. Cl.
USPC ..... 438/270; 438/387; 438/669; 257/E21.011

(58) Field of Classification Search
USPC .......................................... 438/270, 669, 387
See application file for complete search history.

(56) References Cited

U.S. PATENT DOCUMENTS

| | | | |
|---|---|---|---|
| 5,202,855 A | 4/1993 | Morton | |
| 5,881,012 A | 3/1999 | Kawasaki et al. | |
| 6,055,201 A | 4/2000 | Foss et al. | |
| 6,075,746 A | 6/2000 | Ohsawa | |
| 6,252,806 B1 | 6/2001 | Ellis et al. | |
| 6,580,650 B2 | 6/2003 | Ellis et al. | |
| 6,580,654 B2 | 6/2003 | Foss et al. | |
| 6,614,705 B2 | 9/2003 | Foss et al. | |
| 6,970,390 B2 | 11/2005 | Sommer | |
| 6,980,448 B2 | 12/2005 | Foss et al. | |
| 7,167,148 B2 | 1/2007 | Richards | |
| 7,981,736 B2 * | 7/2011 | Juengling | ..... 438/157 |
| 2002/0159301 A1 | 10/2002 | Ellis et al. | |
| 2002/0194425 A1 | 12/2002 | Penchuk | |
| 2005/0007849 A1 | 1/2005 | Sommer | |
| 2005/0057463 A1 | 3/2005 | Richards | |
| 2009/0104744 A1 * | 4/2009 | Juengling | ..... 438/270 |

FOREIGN PATENT DOCUMENTS

| | | |
|---|---|---|
| TW | 200845347 | 11/2008 |
| TW | 201220475 | 5/2012 |

OTHER PUBLICATIONS

"Office Action of Taiwan Counterpart Application", issued on Apr. 2, 2014, p. 1-p. 8, in which the listed references were cited.

* cited by examiner

*Primary Examiner* — Alexander Ghyka
(74) *Attorney, Agent, or Firm* — Jianq Chyun IP Office

(57) ABSTRACT

A method of fabricating a semiconductor device is described. A substrate having first and second areas is provided. A first patterned mask layer having at least one first opening in the first area and at least one second opening in the second area is formed over the substrate, wherein the first opening is smaller than the second opening. A portion of the substrate is removed with the first patterned mask layer as a mask to form first and second trenches respectively in the substrate in the first and second areas, wherein the width and the depth of the first trench are less than those of the second trench. A first dielectric layer is formed at least in the first and second trenches. A conductive structure is formed on the first dielectric layer on at least a portion of the sidewall of each of the first and second trenches.

15 Claims, 9 Drawing Sheets

METHOD OF FABRICATING SEMICONDUCTOR DEVICE

BACKGROUND OF THE INVENTION

1. Field of Invention

This invention relates to a method of fabricating a semiconductor device, and particularly to a method of fabricating a semiconductor device that is able to simplify the fabricating process of the semiconductor device.

2. Description of Related Art

With the advances in technologies, semiconductor transistors are applied to more and more fields, and are often integrated with various other devices to carry out required functions. For example, dynamic random access memory (DRAM) as semiconductor memory usually includes semiconductor transistors, and capacitors that serve as devices for storing the data or information of the DRAM.

The DRAM family can be divided into two categories according to the capacitor structure, wherein the first category has stacked capacitors and the second category has deep-trench capacitors. Moreover, there are various capacitor configurations different in the combination of the materials of the electrodes and the dielectric layer, including metal-oxide-semiconductor (MOS), PN-junction, polysilicon-insulator-polysilicon (PIP) and metal-insulator-metal (MIM) configurations.

In order to simplify the fabricating process of DRAM and lower the fabrication cost, it is important to integrate the fabrication of the capacitors and that of the transistor devices in the semiconductor process.

SUMMARY OF THE INVENTION

Accordingly, this invention provides a method of fabricating a semiconductor device, which is capable of integrating the fabrications of different devices to simplify the fabricating process.

The method of fabricating a semiconductor device is described as follows. A substrate having a first area and a second area is provided. A first patterned mask layer is formed over the substrate, having at least one first opening in the first area and at least one second opening in the second area, wherein the first opening is smaller than the second opening. A portion of the substrate is removed, with the first patterned mask layer as a mask, to form at least one first trench in the substrate in the first area and form at least one second trench in the substrate in the second area, wherein the width of the first trench is less than that of the second trench, and the depth of the first trench is less than that of the second trench. The first patterned mask layer is removed. A first dielectric layer is formed at least in the first trench and the second trench. A conductor structure is formed on the first dielectric layer on at least a portion of the sidewall of the first trench and on the first dielectric layer on at least a portion of the sidewall of the second trench.

In an embodiment, the conductor structure includes a first conductor layer filling a portion of the first trench, and a second conductor layer filling a portion of the second trench. Such a conductor structure may be formed with steps including: forming a conductor material layer filling up the first trench and the second trench, and removing the conductor material layer outside of the first trench and the second trench and a portion of the conductor material layer in the first trench and the second trench. The method may further include: forming, in the first trench and the second trench, a second dielectric layer that fills up the first trench and the second trench.

In another embodiment, the conductor structure includes a first conductor layer filling a portion of the first trench, and a second conductor layer filling up the second trench and extending to above the substrate beside the second trench. Such conductor structure may be formed by steps including: forming a conductor material layer filling up the first and the second trenches, forming a second patterned mask layer covering the conductor material layer in the second area, and removing, with the second patterned mask layer as a mask, the conductor material layer outside of the first trench and a portion of the conductor material layer in the first trench. The method may further include: forming, over the first conductor layer and the second conductor layer, a second dielectric layer that fills up the first trench.

In still another embodiment, the conductor structure includes: a first conductor layer only on the first dielectric layer on the portion of the sidewall of the first trench, and a second conductor layer only on the first dielectric layer on the portion of the sidewall of the second trench. Such a conductor structure may be formed by steps including: forming a substantially conformal conductor material layer on the first dielectric layer, and performing an etching process to the conductor material layer to remove portions of the conductor material layer respectively at the bottom of the first trench, at the bottom of the second trench, on an upper end portion of the sidewall of the first trench, and on an upper end portion of the sidewall of the second trench. The etching process may further comprise: removing the first dielectric layer at the bottom of the first trench and at the bottom of the second trench, and removing a portion of the substrate under the bottom of the first trench and under the bottom of the second trench. The conductor structure may alternatively be formed by steps including: forming a substantially conformal conductor material layer on the first dielectric layer, forming a third patterned mask layer on the conductor material layer on the sidewall of the first trench and on the conductor material layer on the sidewall of the second trench, and performing an etching process to the conductor material layer, with the third patterned mask layer as a mask, to remove portions of the conductor material layer respectively at the bottom of the first trench, at the bottom of the second trench, on an upper end portion of the sidewall of the first trench, and on an upper end portion of the sidewall of the second trench.

In yet another embodiment, the conductor structure includes: a first conductor layer only on the first dielectric layer on the portion of the sidewall of the first trench, and a second conductor layer formed conformally on the first dielectric layer in the second area. Such a conductor structure may be formed by steps including: forming a substantially conformal conductor material layer on the first dielectric layer, forming a fourth patterned mask layer covering the conductor material layer in the second area, and removing, with the fourth patterned mask layer as a mask, the conductor material layer at the bottom of the first trench and on an upper end portion of the sidewall of the first trench.

Accordingly, the method of fabricating a semiconductor device of this invention can simultaneously process the first area and the second area and thereby integrate the fabrications of different types of devices, so that the fabricating process is simplified and the fabrication cost is lowered.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention.

FIGS. 1A-1F illustrate, in a cross-sectional view, a method of fabricating a semiconductor device according to the first embodiment of this invention.

Figure 1A:
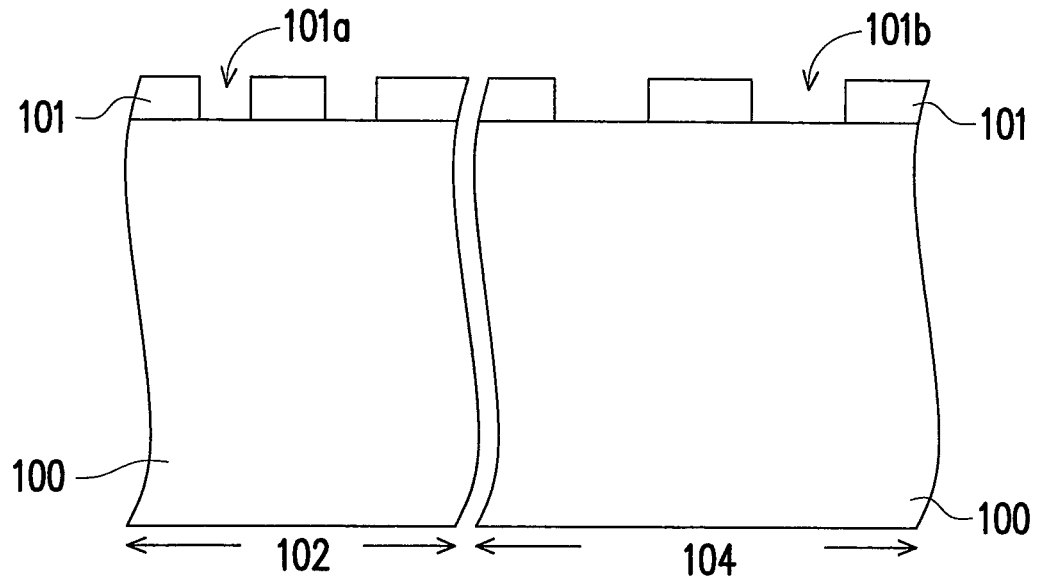
FIGS. 1A-1F illustrate, in a cross-sectional view, a method of fabricating a semiconductor device according to a first embodiment of this invention.

Referring to FIG. 1A, a substrate 100 having a first area 102 and a second area 104 is provided. The substrate 100 may be a Si-substrate. The first area 102 may include a transistor device area. The second area 104 may include a capacitor area.

A first patterned mask layer 101 is then formed over the substrate 100, having at least one first opening 101a in the first area 102 and at least one second opening 101b in the second area 104, wherein the first opening 101a is smaller than the second opening 101b. The first patterned mask layer 101 may include a photoresist material and be defined by a lithography process, but is not limited thereto. In other embodiments, the first patterned mask layer 101 may alternatively be a patterned hard mask layer.

Figure 1B:
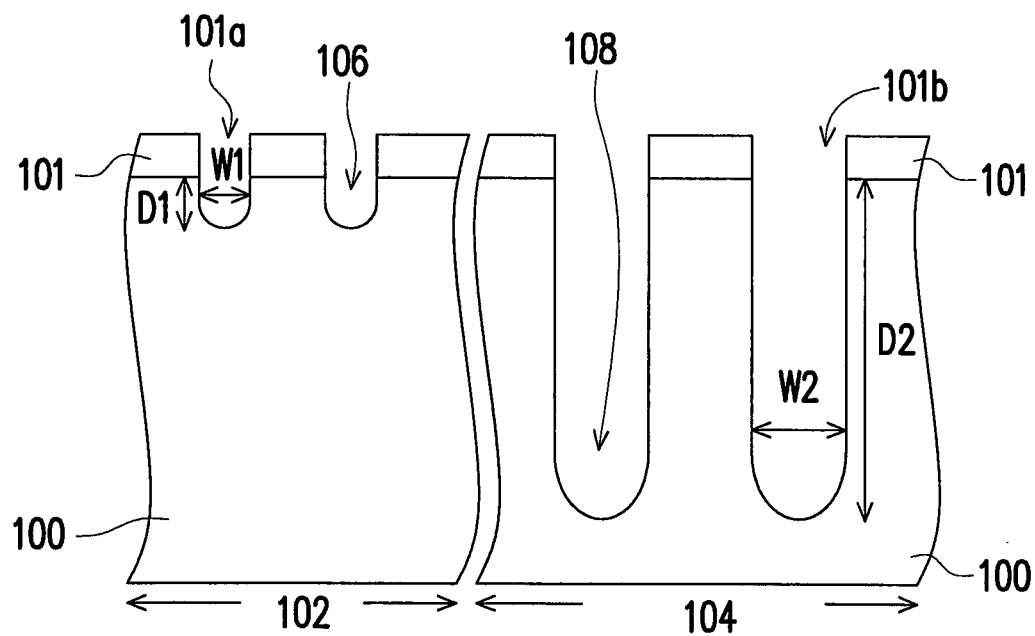

Referring to FIG. 1B, portions of the substrate 100 are removed, with the first patterned mask layer 101 as a mask, to form first trenches 106 each having a width W1 and a depth D1 in the substrate 100 in the first area 102 and also form second trenches 108 each with a width W2 and a depth D2 in the substrate 100 in the second area 104. The removal may be done through dry etching. Because the opening 101a of the first patterned mask layer 101 in the first area 102 is smaller than the opening 101b of the same in the second area 104, the width W1 of the first trench 106 is less than the width W2 of the second trench 108, and the depth D1 of the first trench 106 is less than the depth D2 of the second trench 108 due to the loading effect in the etching.

Figure 1C:
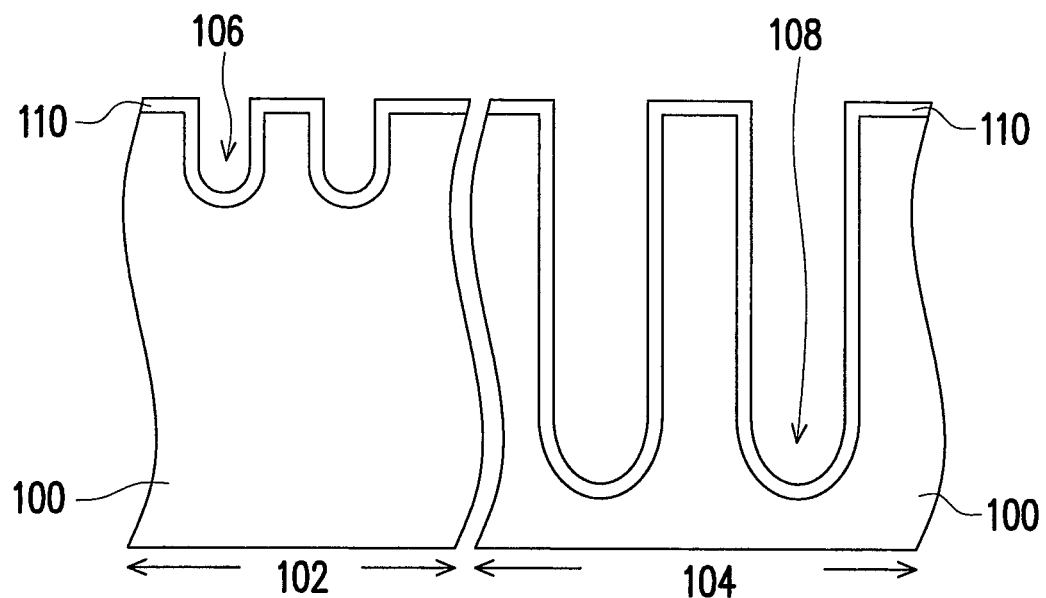

Referring to FIG. 1C, the first patterned mask layer 101 is removed, possibly by dry etching A first dielectric layer 110 is then formed substantially conformally over the substrate 100, filling in the first trenches 106 and the second trenches 108. The first dielectric layer 110 may include a high-k material, and may be formed by chemical vapor deposition (CVD).

Figure 1D:
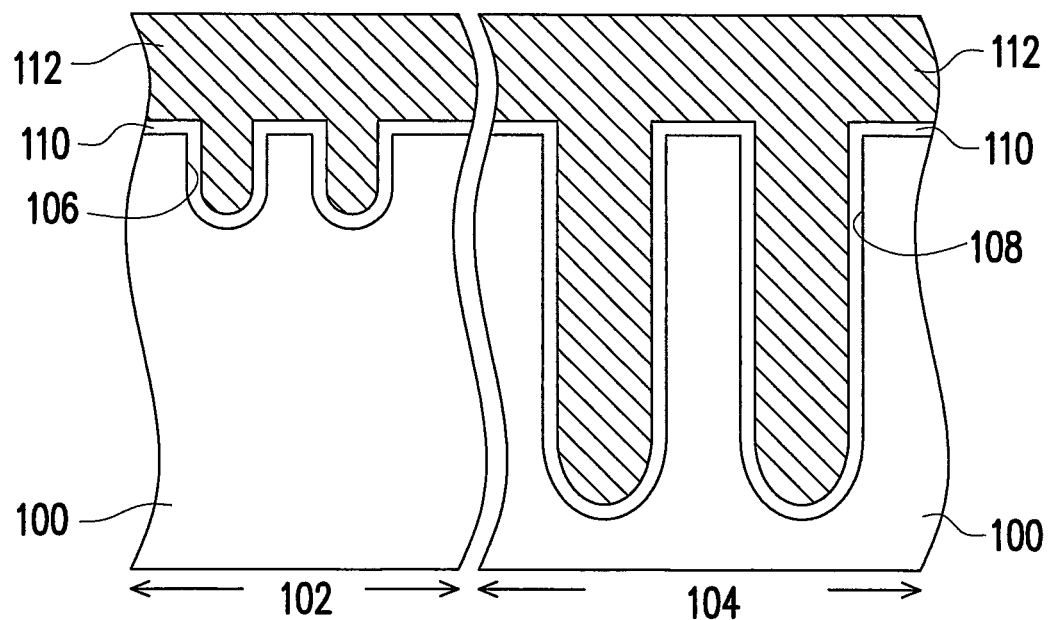

Referring to FIG. 1D, a conductor material layer 112 is formed on the first dielectric layer 110, filling up the first trenches 106 and the second trenches 108. The conductor material layer may include a metallic material, and may be formed by CVD.

Figure 1E:
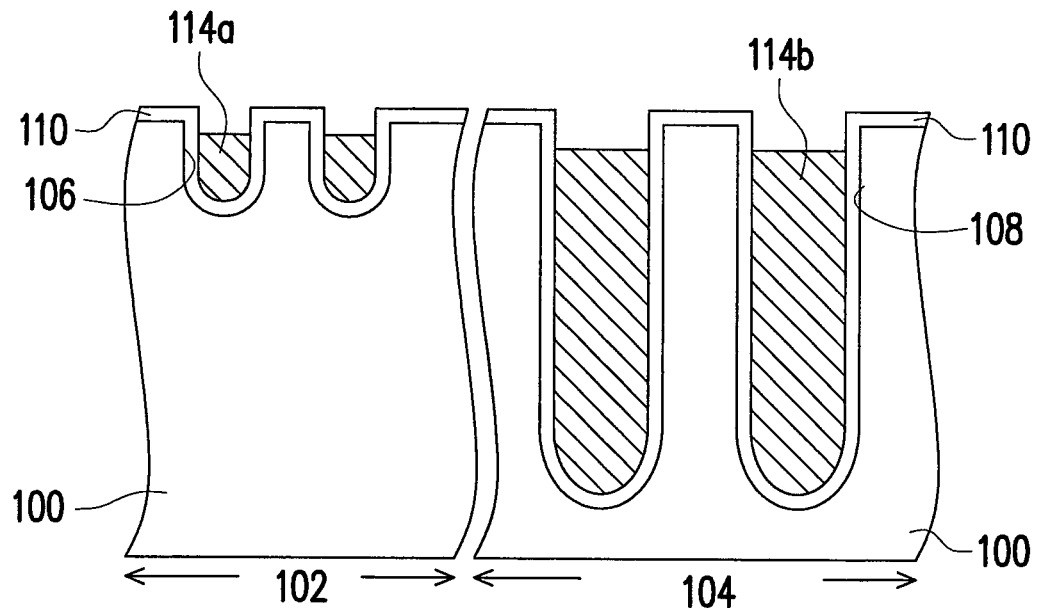

Referring to FIG. 1E, the conductor material layer 112 outside of the first trenches 106 and the second trenches 108 and a portion of the conductor material layer 112 in each of the first trenches 106 and the second trenches 108 are removed to form a first conductor layer 114a filling a portion of each of the first trenches 106 and a second conductor layer 114b filling a portion of each of the second trenches 108. The removal may be done by etching back the conductor material layer 112.

Though the first conductor layer 114a and the second conductor layer 114b are formed with the above process in this embodiment, their forming process is not limited thereto. In addition, in the first embodiment, the first conductor layer 114a may serve as the gates of the transistor devices, and the second conductor layer 114b may serve as upper electrodes of the capacitors. Thus, the method of fabricating a semiconductor device allows the upper electrodes (the second conductor layer 114b) of the capacitors and the gates (the first conductor layer 114a) of the transistor devices to be formed simultaneously, so that the number of the fabricating steps is reduced.

Figure 1F:
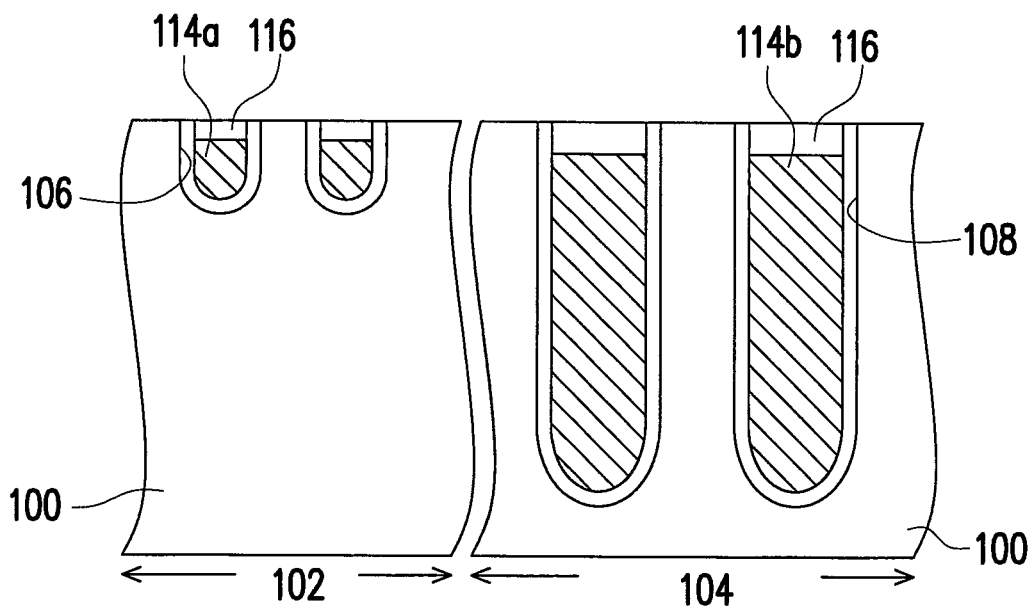

Referring to FIG. 1F, it is feasible to further form, in the first trenches 106 and the second trenches 108, a second dielectric layer 116 filling up the first trenches 106 and the second trenches 108 and covering the first conductor layer 114a and the second conductor layer 114b. The second dielectric layer 116 may include silicon oxide, silicon nitride, or any other suitable dielectric material. The second dielectric layer 116 may be formed by forming a dielectric material layer by CVD and then performing chemical mechanical polishing (CMP) or etching-back to the dielectric material layer. Moreover, after the dielectric material layer is partially removed, the removal process may be continued to further remove the first dielectric layer 110 on the substrate 100 outside of the first trenches 106 and the second trenches 108. The subsequent steps for finishing the fabrication of the semiconductor devices are well known to one of ordinary skill in the art and are not described herein.

In the first embodiment, the first trenches 106 and the second trenches 108 being different in width and depth are simultaneously formed in the substrate 100 in the first area 102 and the second area 104, respectively, by utilizing a single first patterned mask layer 101 as an etching mask, so that the fabrications of different types of devices can be integrated. As a result, the fabricating process can be simplified and the fabricating cost can be lowered.

Figure 2A:
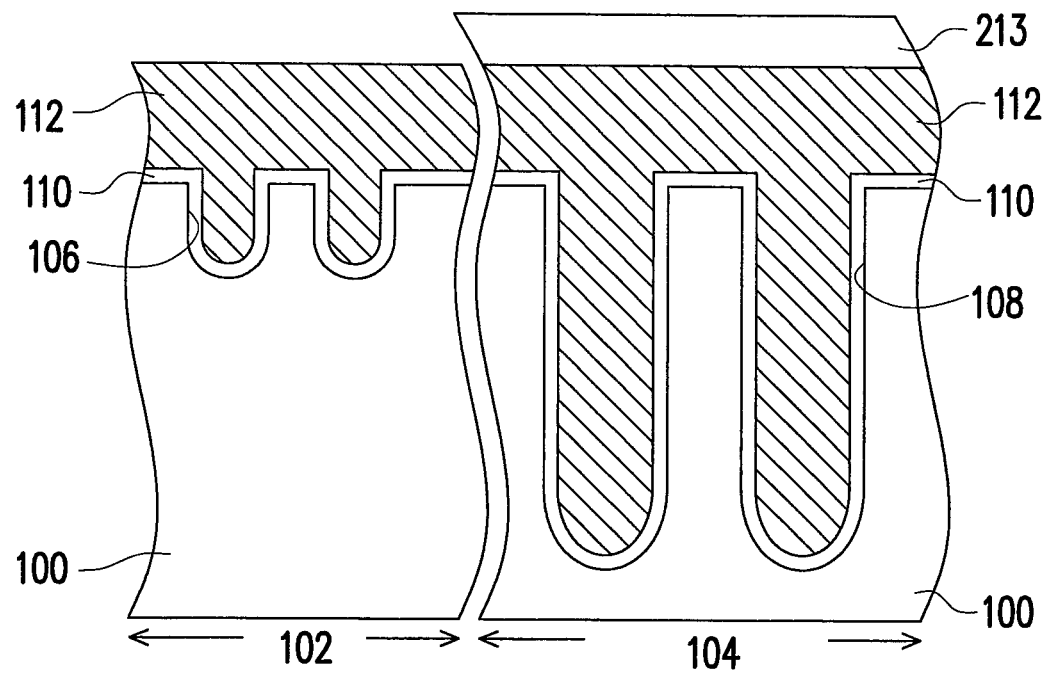
FIGS. 2A-2C illustrate, in a cross-sectional view, a method of fabricating a semiconductor device according to a second embodiment of this invention.
Figure 2B:
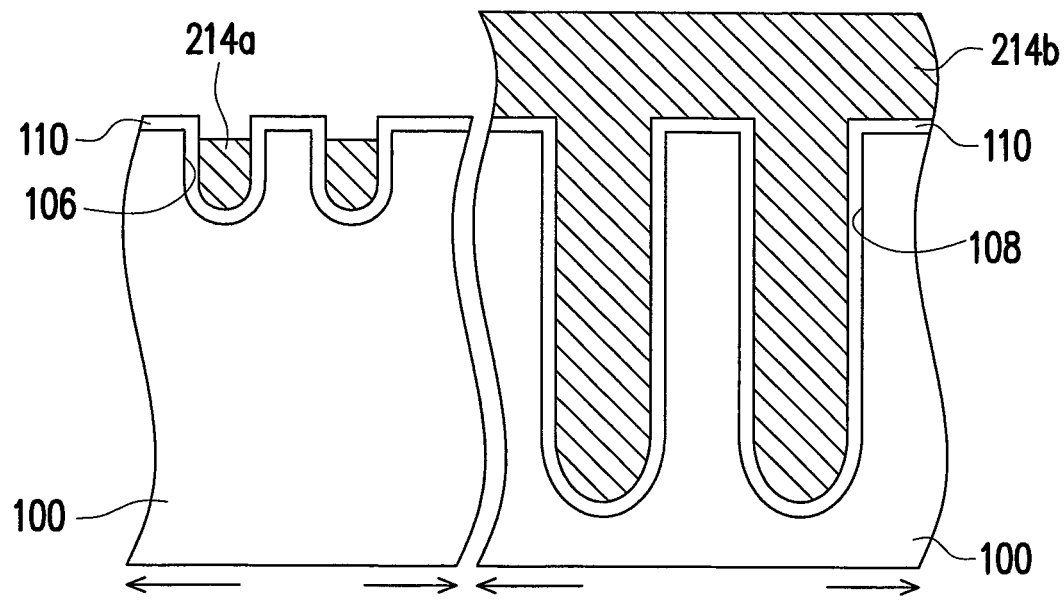
Figure 2C:
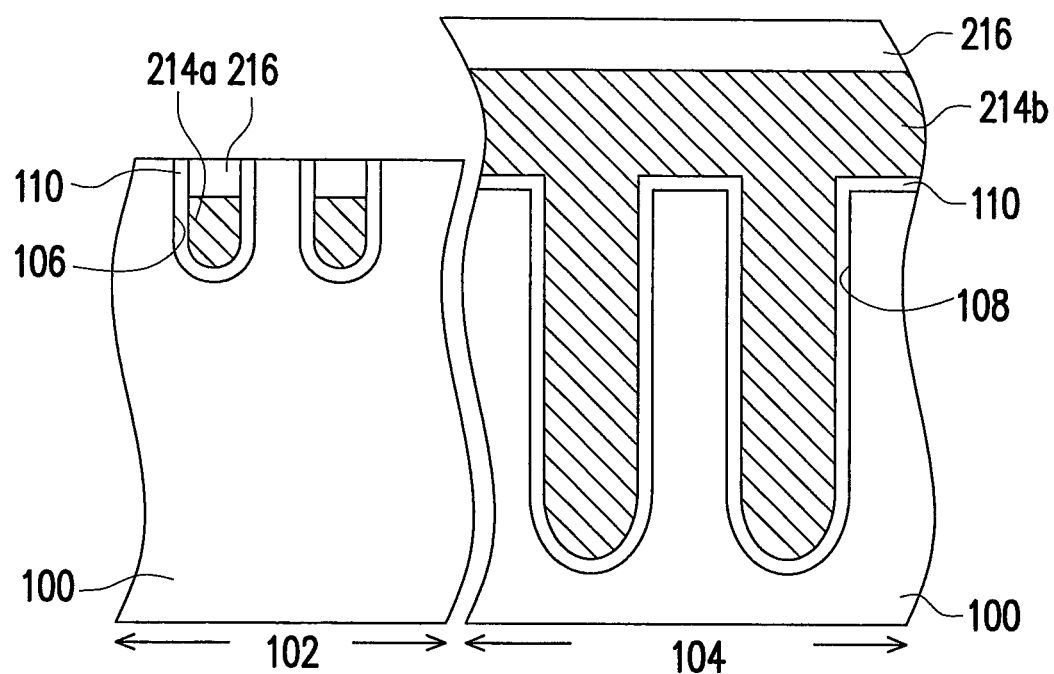

FIGS. 2A-2C illustrate, in a cross-sectional view, a method of fabricating a semiconductor device according to the second embodiment of this invention, wherein the step shown in FIG. 2A follows the step shown in FIG. 1D. The materials and the forming methods of some layers in the second embodiment may be the same as those of the same or similar layers in the first embodiment, and are not repeated again.

Referring to FIG. 2A, a second patterned mask layer 213 is formed covering the conductor material layer 112 in the second area 104. The second patterned mask layer 213 may include a photoresist material, and may be formed by a lithography process.

Referring to FIG. 2B, the conductor material layer 112 outside of the first trenches 106 and a portion of the conductor material layer 112 in each of the first trenches 106 are removed, with the second patterned mask layer 213 as a mask, to form a first conductor layer 214a filling a portion of each of the first trenches 106 and a second conductor layer 214b filling up the second trenches 108 and extending to above the substrate 100 beside the second trenches 108. The removal process may include an etching-back process. The second embodiment is different from the first embodiment in that a second conductor layer 214b with a larger area can be obtained.

In the second embodiment, when the first area 102 is a transistor device area, the first conductor layer 214a may function as the gates of the transistor devices; when the second area 104 is a capacitor area, the second conductor layer 214b may function as the upper electrodes of the capacitors. Because the second conductor layer 214b is formed with a larger area, the capacitor has a larger capacitance.

After the first conductor layer 214a and the second conductor layer 214b are defined, the second patterned mask layer 213 is removed.

Referring to FIG. 2C, it is possible to further form a second dielectric layer 216 that covers the first conductor layer 214a and the second conductor layer 214b and fills up the first trenches 106. The second dielectric layer 216 may be formed by forming a dielectric material layer with CVD and then etching back the dielectric material layer in the first area 102. It is also possible to continue to remove the first dielectric layer 110 on the substrate 100 beside the first trenches 106 after the corresponding portion of the dielectric material layer is removed by etching. The subsequent steps for finishing the fabrication of the semiconductor devices are well known to one of ordinary skill in the art and are not described herein.

As in the first embodiment, the first trenches 106 and the second trenches 108 being different in width and depth are also simultaneously formed in the substrate 100 in the first area 102 and the second area 104, respectively, in the second embodiment, so the fabrications of different types of devices can be integrated, the fabricating process can be simplified and the fabricating cost can be lowered. Moreover, because the second patterned mask layer 213 is formed in the second area 104, the second conductor layer 214b (upper electrode) can be formed with a larger area so that the capacitor has a larger capacitance.

Figure 3A:
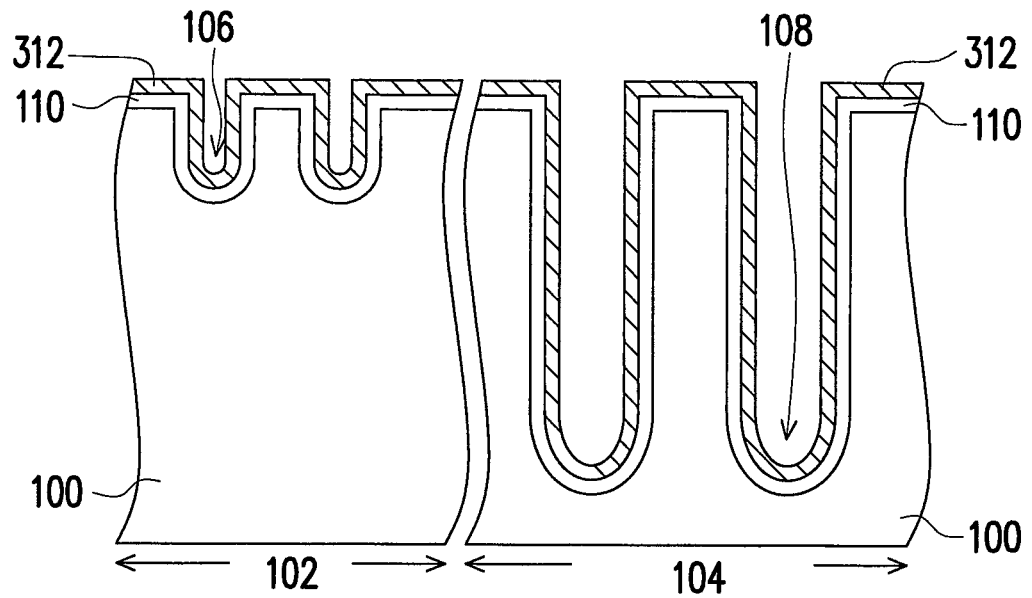
FIGS. 3A-3B illustrate, in a cross-sectional view, a method of fabricating a semiconductor device according to a third embodiment of this invention.
Figure 3B:
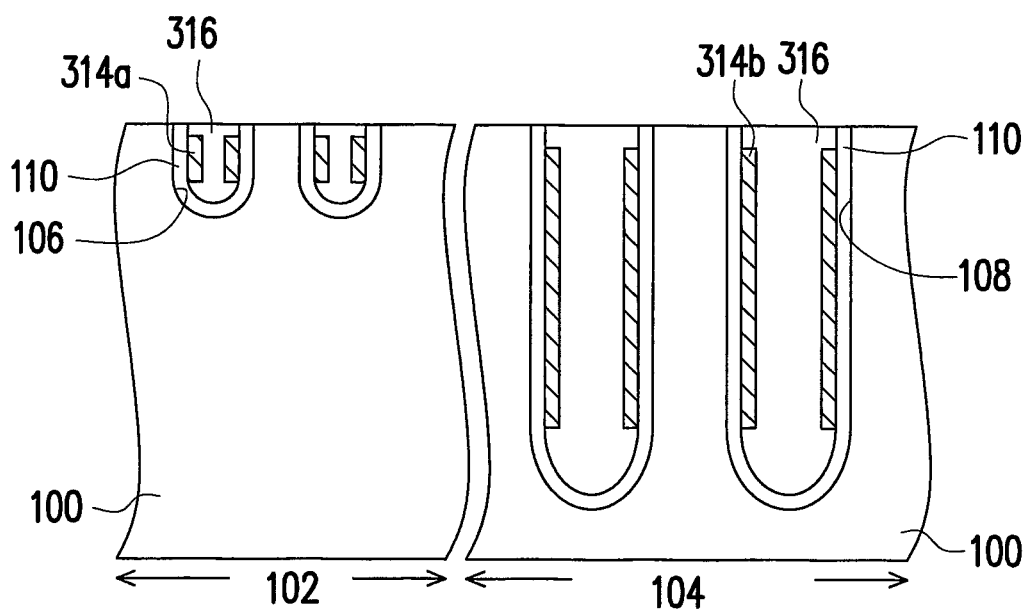

FIGS. 3A-3B illustrate, in a cross-sectional view, a method of fabricating a semiconductor device according to the third embodiment of this invention, wherein the step shown in FIG. 3A follows the step shown in FIG. 1C. The materials and the forming methods of some layers in the third embodiment may be the same as those of the same or similar layers in the first embodiment, and are not repeated again.

Referring to FIG. 3A, a substantially conformal conductor material layer 312 is formed on the first dielectric layer 110. The conductor material layer 312 may include a metallic material, and may be formed with CVD.

Referring to FIG. 3B, portions of the conductor material layer 312 respectively at the bottom of each of the first trenches 106 and the second trenches 108 and on an upper end portion of the sidewall of each of the first trenches 106 and the second trenches 108 are removed, so as to form a first conductor layer 314a only on the first dielectric layer 110 on a portion of the sidewall of each of the first trenches 106 and a second conductor layer 314b only on the first dielectric layer 110 on a portion of the sidewall of each of the second trenches 108. The removal may be done by performing dry etching to the conductor material layer 312. In other embodiments, after the above portions of the conductor material layer 312 are removed by etching, over etching may be performed to remove portions of the first dielectric layer 110 at the bottoms of the first trenches 106 and the second trenches 108 (not shown) and even remove portions of the substrate 100 under the bottoms of the first trenches 106 and the second trenches 108 (not shown), so as to make sure that the conductor material layer 312 at the bottom of each of the first trenches 106 and the second trenches 108 is completely removed.

In the third embodiment, when the first area 102 is a transistor device area, the first conductor layer 314a may function as the gates of the transistor devices; when the second area 104 is a capacitor area, the second conductor layer 314b may function as the upper electrodes of the capacitors.

Moreover, it is possible to further form in the first trenches 106 and the second trenches 108 a second dielectric layer 316 that fills up the first trenches 106 and the second trenches 108 and covers the first conductor layer 314a and the second conductor layer 314b. The second dielectric layer 316 may be formed by forming a dielectric material layer with CVD (not shown) and then performing CMP or etching-back to the dielectric material layer. It is also possible to continue to remove the first dielectric layer 110 on the substrate 100 beside the first trenches 106 and the second trenches 108 after the corresponding portion of the dielectric material layer is removed by CMP or etching. The subsequent steps for finishing the fabrication of the semiconductor devices are well known to those of ordinary skill in the art and are not described herein.

As in the above embodiments, the first trenches 106 and the second trenches 108 being different in width and depth are also simultaneously formed in the substrate 100 in the first area 102 and the second area 104, respectively, in the third embodiment, so that the fabrications of different types of devices can be easily integrated, the fabricating process can be simplified, and the fabricating cost can be lowered.

Figure 4A:
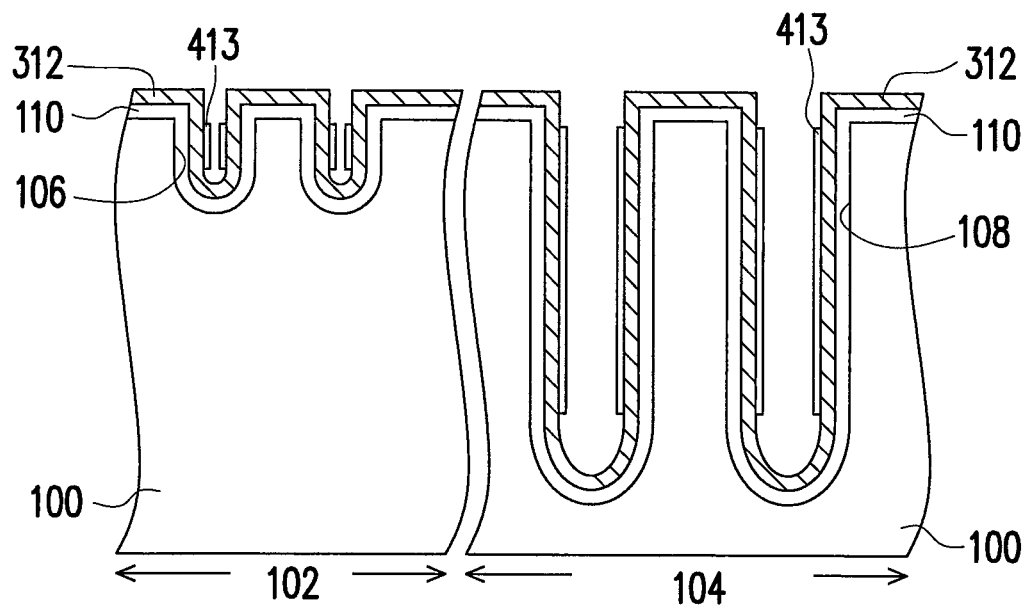
FIGS. 4A-4C illustrate, in a cross-sectional view, a method of fabricating a semiconductor device according to a fourth embodiment of this invention.
Figure 4B:
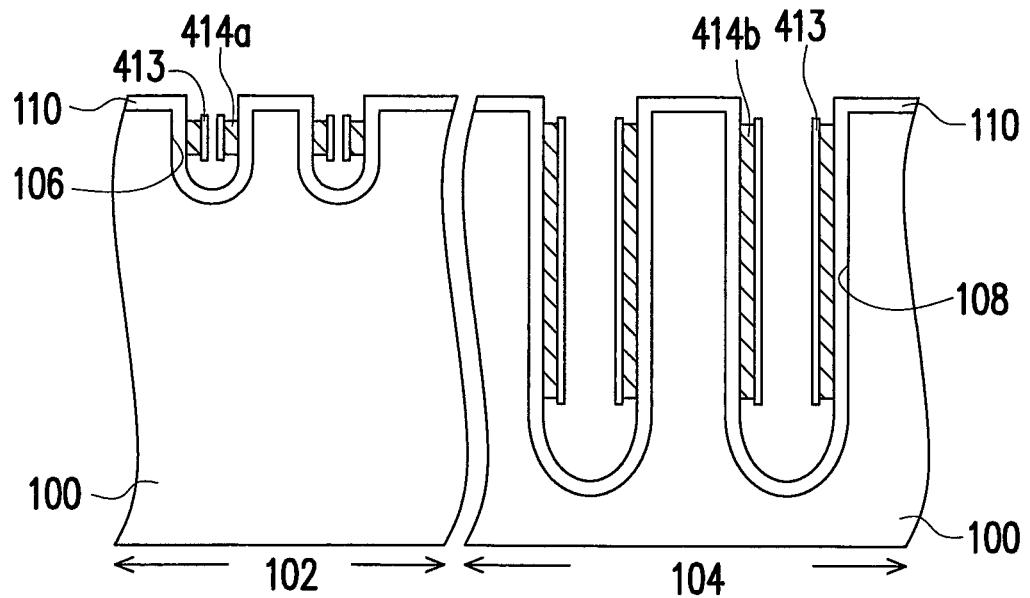

FIGS. 4A-4B illustrate, in a cross-sectional view, a method of fabricating a semiconductor device according to a fourth embodiment of this invention, wherein the step shown in FIG. 4A follows the step shown in FIG. 3A. The materials and the forming methods of some layers in the fourth embodiment may be the same as those of the same or similar layers in the third embodiment, and are not repeated again.

Referring to FIG. 4A, a third patterned mask layer 413 is formed on the conductor material layer 312 on the sidewall of each of the first trenches 106 and the second trenches 108. The third patterned mask layer 413 may be formed by forming a mask material layer substantially conformally on the conductor material layer 312 (not shown) and then performing anisotropic dry etching to the mask material layer.

Referring to FIG. 4B, portions of the conductor material layer 312 respectively at the bottom of each of the first trenches 106 and the second trenches 108 and on an upper end portion of the sidewall of each of the first trenches 106 and the second trenches 108 are removed, with the $3^{rd}$ patterned mask layer 413 as a mask, to form a first conductor layer 414a and a second conductor layer 414b each of which is smaller in area than the corresponding portion of the third patterned mask layer 413. Such removal may be done by performing wet etching to the conductor material layer 312. Nevertheless, in other embodiments, the area of each of the first conductor layer 414a and the second conductor layer 414b may be equal to or larger than that of the corresponding portion of the third patterned mask layer 413.

In the fourth embodiment, when the first area 102 is a transistor device area, the first conductor layer 414a may function as the gates of the transistor devices; when the second area 104 is a capacitor area, the second conductor layer 414b may function as the upper electrodes of the capacitors.

Figure 4C:
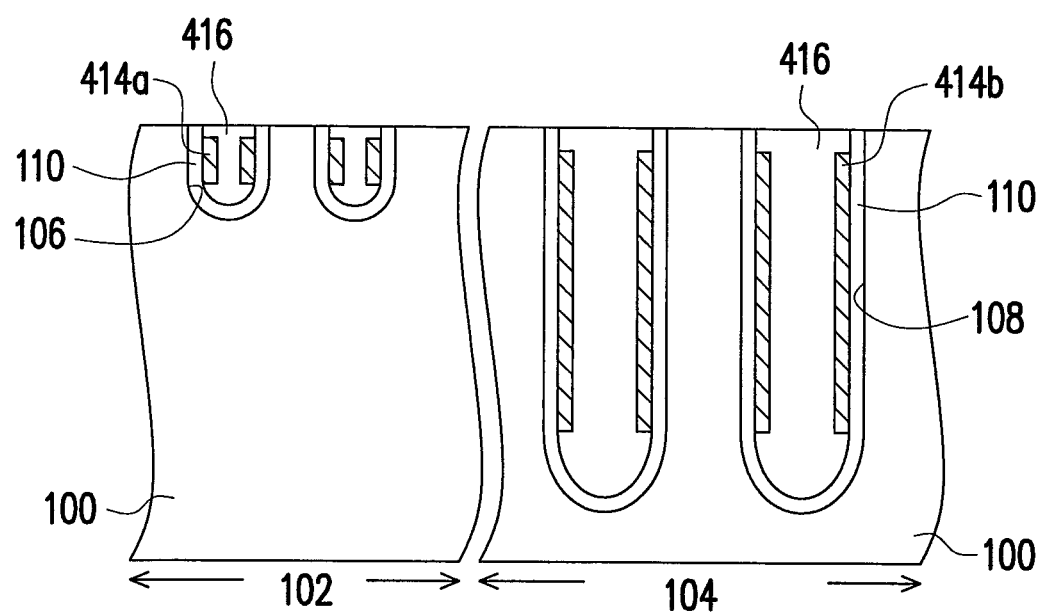

Referring to FIG. 4C, the third patterned mask layer 413 is removed, and then a second dielectric layer 416 is formed in the first trenches 106 and the second trenches 108, filling up the first trenches 106 and the second trenches 108 and covering the first conductor layer 414a and the second conductor layer 414b. The second dielectric layer 416 may be formed by forming a dielectric material layer with CVD (not shown) and performing CMP or etching-back to the dielectric material layer. It is also possible to continue to remove the first dielectric layer 110 on the substrate 100 beside the first trenches 106 and the second trenches 108 after the corresponding portion of the dielectric material layer is removed by CMP or etching. The subsequent steps for finishing the fabrication of the semiconductor devices are well known to one of ordinary skill in the art and are not described herein.

As in the above embodiments, the first trenches 106 and the second trenches 108 being different in width and depth are also simultaneously formed in the substrate 100 in the first area 102 and the second area 104, respectively, in the fourth embodiment, so that the fabrications of different types of devices can be easily integrated, the fabricating process can be simplified, and the fabricating cost can be lowered.

Figure 5A:
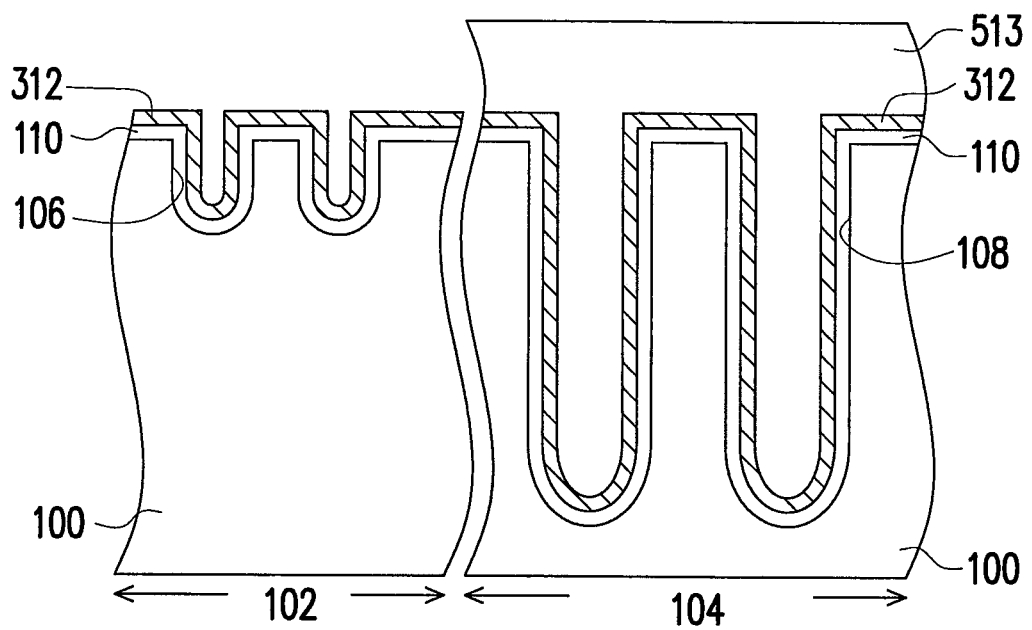
FIGS. 5A-5B illustrate, in a cross-sectional view, a method of fabricating a semiconductor device according to a fifth embodiment of this invention.
Figure 5B:
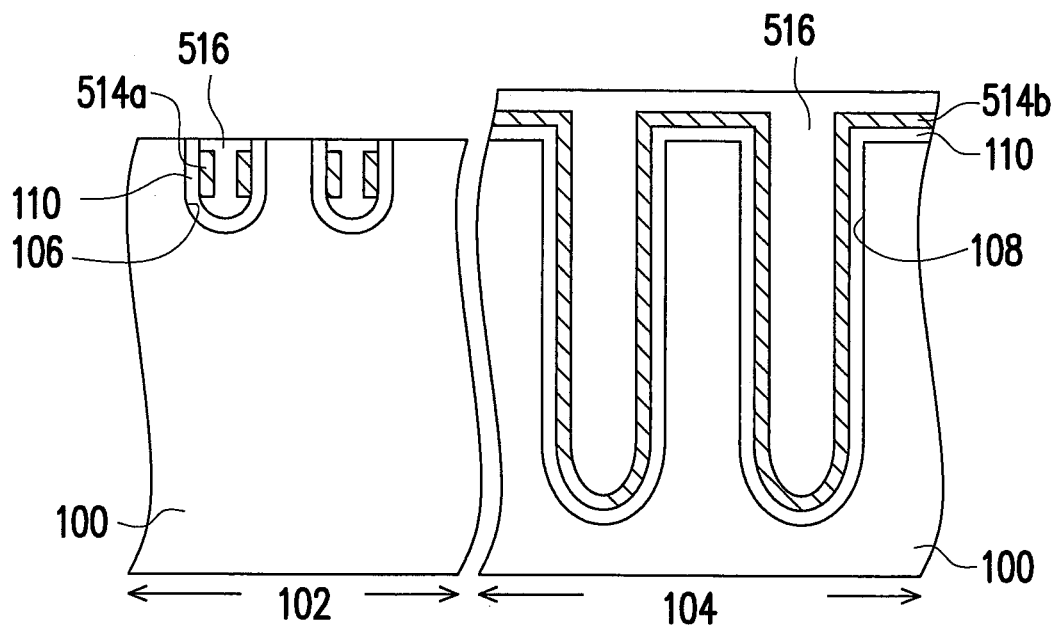

FIGS. 5A-5B illustrate, in a cross-sectional view, a method of fabricating a semiconductor device according to a fifth embodiment of this invention, wherein the step shown in FIG. 5A follows the step shown in FIG. 3A. The materials and the forming methods of some layers in the fifth embodiment may be the same as those of the same or similar layers in the third embodiment, and are not repeated again.

Referring to FIG. 5A, a fourth patterned mask layer 513 is formed covering the conductor material layer 312 in the entire second area 104. The fourth patterned mask layer 513 may include a photoresist material and be formed by a lithography process.

Referring to FIG. 5B, portions of the conductor material layer 312 respectively at the bottom of each of the first trenches 106 and on an upper end portion of the sidewall of each of the first trenches 106 are removed, with the fourth patterned mask layer 513 as a mask, to form a first conductor layer 514a only on the first dielectric layer 110 on a portion of the sidewall of each of the first trenches 106 and leave a second conductor layer 514b being conformal on the first dielectric layer 110 in the entire second area 104. The removal can be done by performing dry etching to the conductor material layer 312. The fifth embodiment is different from the third embodiment in that a second conductor layer 514b with a larger area can be obtained.

After the first conductor layer 514a and the second conductor layer 514b are formed, the fourth patterned mask layer 513 is removed.

In the fifth embodiment, when the first area 102 is a transistor device area, the first conductor layer 514a may function as the gates of the transistor devices; when the second area 104 is a capacitor area, the second conductor layer 514b may function as the upper electrodes of the capacitors. Because the second conductor layer 514b is formed with a larger area, the capacitor has a larger capacitance.

Moreover, it is possible to further form, in the first trenches 106 and on the second conductor layer 514b in the entire second area 104, a second dielectric layer 516 that covers the first conductor layer 514a and the second conductor layer 514b entirely. The second dielectric layer 516 may be formed by forming a dielectric material layer with CVD (not shown) and then etching back the dielectric material layer. It is also possible to continue to remove the first dielectric layer 110 on the substrate 100 beside the first trenches 106 after the corresponding portion of the dielectric material layer is removed by etching. The subsequent steps for finishing the fabrication of the semiconductor devices are well known to one of ordinary skill in the art and are not described herein.

As in the above embodiments, the first trenches 106 and the second trenches 108 being different in width and depth are also simultaneously formed in the substrate 100 in the first area 102 and the second area 104, respectively, in the fifth embodiment, so that the fabrications of different types of devices can be integrated, the fabricating process can be simplified, and the fabricating cost can be lowered. Moreover, because the fourth patterned mask layer 513 is formed in the second area 104, the second conductor layer 514b (upper electrode) can be formed with a larger area so that the capacitor can have a larger capacitance.

Accordingly, in any of the above first to fifth embodiments, first trenches and second trenches being different in width and depth are simultaneously formed in the substrate in the first area and the second area, respectively, so that the fabrications of different types of devices can be integrated, the fabricating process can be simplified, and the fabricating cost can be lowered. Moreover, when the semiconductor device fabricating methods of the above embodiments are applied to form transistor devices and capacitors, each transistor device can have a greater channel length and each capacitor can have a greater capacitance.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a semiconductor device, comprising:
   providing a substrate that has a first area and a second area;
   forming, over the substrate, a first patterned mask layer that has at least one first opening in the first area and has a plurality of second openings in the second area, wherein the first opening is smaller than the second openings;
   removing a portion of the substrate, with the first patterned mask layer as a mask, to form at least one first trench in the substrate in the first area and form a plurality of second trenches in the substrate in the second area, wherein a width of the first trench is less than a width of the second trenches, and a depth of the first trench is less than a depth of the second trenches;
   removing the first patterned mask layer;
   forming a first dielectric layer at least in the first trench and the second trenches; and
   forming a conductor structure on the first dielectric layer on at least a portion of a sidewall of the first trench and on the first dielectric layer on at least a portion of a sidewall of the second trenches, wherein the first area comprises a transistor device area, and the second area comprises a capacitor area.

2. The method of claim 1, wherein the first dielectric layer comprises a high-k material.

3. The method of claim 1, wherein the conductor structure comprises:
   a first conductor layer filling a portion of the first trench; and
   a second conductor layer filling a portion of the second trenches.

4. The method of claim 3, wherein forming the conductor structure comprises:
   forming a conductor material layer filling up the first trench and the second trenches; and
   removing the conductor material layer outside of the first trench and the second trenches and a portion of the conductor material layer in the first trench and the second trenches.

5. The method of claim 4, further comprising: forming, in the first trench and the second trenches, a second dielectric layer that fills up the first trench and the second trenches.

6. The method of claim 1, wherein the conductor structure comprises:

a first conductor layer filling a portion of the first trench; and a second conductor layer filling up the second trenches and extending to above the substrate beside the second trenches.

7. The method of claim 6, wherein forming the conductor structure comprises:

forming a conductor material layer filling up the first trench and the second trenches;

forming a second patterned mask layer covering the conductor material layer in the second area; and removing, with the second patterned mask layer as a mask, the conductor material layer outside of the first trench and a portion of the conductor material layer in the first trench.

8. The method of claim 7, further comprising: forming, over the first conductor layer and the second conductor layer, a second dielectric layer that fills up the first trench.

9. The method of claim 1, wherein the conductor structure comprises:

a first conductor layer only on the first dielectric layer on the portion of the sidewall of the first trench; and a second conductor layer only on the first dielectric layer on the portion of the sidewall of the second trenches.

10. The method of claim 9, wherein forming the conductor structure comprises:

forming a substantially conformal conductor material layer on the first dielectric layer; and performing an etching process to the conductor material layer to remove portions of the conductor material layer respectively at a bottom of the first trench, at a bottom of the second trenches, on an upper end portion of the sidewall of the first trench, and on an upper end portion of the sidewall of the second trenches.

11. The method of claim 10, wherein the etching process further comprises:

removing the first dielectric layer at the bottom of the first trench and at the bottom of the second trenches; and removing a portion of the substrate under the bottom of the first trench and under the bottom of the second trenches.

12. The method of claim 9, wherein forming the conductor structure comprises:

forming a substantially conformal conductor material layer on the first dielectric layer;

forming a third patterned mask layer on portions of the conductor material layer respectively on the sidewall of the first trench and on the sidewall of the second trenches; and performing an etching process to the conductor material layer, with the third patterned mask layer as a mask, to remove portions of the conductor material layer respectively at a bottom of the first trench, at a bottom of the second trenches, on an upper end portion of the sidewall of the first trench, and on an upper end portion of the sidewall of the second trenches.

13. The method of claim 1, wherein the conductor structure comprises:

a first conductor layer only on the first dielectric layer on the portion of the sidewall of the first trench; and a second conductor layer formed conformally on the first dielectric layer in the second area.

14. The method of claim 13, wherein forming the conductor structure comprises:

forming a substantially conformal conductor material layer on the first dielectric layer;

forming a fourth patterned mask layer covering the conductor material layer in the second area; and removing, with he fourth patterned mask layer as a mask, the conductor material layer at a bottom of the first trench and on an upper end portion of the sidewall of the first trench.

15. The method of claim 1, wherein the conductor structure comprises a metallic material.

\* \* \* \* \*